(12) United States Patent
Agrawal

(10) Patent No.: US 10,965,310 B1
(45) Date of Patent: Mar. 30, 2021

(54) LOOP DELAY COMPENSATION IN A SIGMA-DELTA MODULATOR

(71) Applicant: TEXAS INSTRUMENTS INCORPORATED, Dallas, TX (US)

(72) Inventor: Meghna Agrawal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/884,902

(22) Filed: May 27, 2020

(51) Int. Cl.
| H03M 1/06 | (2006.01) |
| H03M 3/00 | (2006.01) |
| H03K 5/24 | (2006.01) |
| H03M 1/12 | (2006.01) |
| H03M 1/10 | (2006.01) |

(52) U.S. Cl.
CPC ............ *H03M 3/322* (2013.01); *H03K 5/249* (2013.01); *H03K 5/2481* (2013.01); *H03M 3/458* (2013.01); *H03M 1/06* (2013.01); *H03M 1/1009* (2013.01); *H03M 1/12* (2013.01); *H03M 1/124* (2013.01)

(58) Field of Classification Search
CPC ...... H03M 1/06; H03M 1/1009; H03M 1/124; H03M 1/12
USPC .......................... 341/118, 120, 122, 155, 126
See application file for complete search history.

(56) References Cited

U.S. PATENT DOCUMENTS 10,447,290 B2 * 10/2019 Ghosh .................. H03M 1/089

\* cited by examiner

*Primary Examiner* — Joseph J Lauture
(74) *Attorney, Agent, or Firm* — Ebby Abraham; Charles A. Brill; Frank D. Cimino

(57) ABSTRACT

A circuit includes a transconductance stage having first and second outputs. The circuit also includes a comparator having first and second inputs. The first input is coupled to the first output, and the second input is coupled to the second output. The comparator includes first through fifth transistors and a pair of cross-coupled transistors. The pair of cross-coupled transistors is coupled to the second current terminals of the first and second transistors. The second current terminal of the third transistor is coupled to the second current terminal of the first transistor, and the first current terminals of the first, second, and third transistors are coupled together. The second current terminals of the fourth and fifth transistors are coupled together and to the control input of the third transistor.

20 Claims, 7 Drawing Sheets

LOOP DELAY COMPENSATION IN A SIGMA-DELTA MODULATOR

BACKGROUND

An analog-to-digital converter (ADC) converts an input analog signal into a digital signal. One type of ADC includes a delta-sigma modulator in which a change in the analog input signal is encoded. The modulator includes, among other components, an integrator and a comparator. The output of the comparator is used to generate a feedback signal for the integrator. Continuous-time delta-sigma modulators suffer from excess loop delay due to the propagation delay through the comparator. The comparator samples the output signal from the integrator and compares the sampled output signal to a threshold. Any propagation delay through the comparator means that the feedback signal from the comparator is not based on the current comparator output signal but rather on a delayed comparator output signal. The comparator delay degrades the performance of the feedback loop, and the comparator delay can cause the modulator to be unstable.

SUMMARY

In at least one example, a circuit includes a transconductance stage having first and second outputs. The circuit also includes a comparator having first and second inputs. The first input is coupled to the first output, and the second input is coupled to the second output. The comparator includes first through fifth transistors and a pair of cross-coupled transistors. The pair of cross-coupled transistors is coupled to the second current terminals of the first and second transistors. The second current terminal of the third transistor is coupled to the second current terminal of the first transistor, and the first current terminals of the first, second, and third transistors are coupled together. The second current terminals of the fourth and fifth transistors are coupled together and to the control input of the third transistor.

BRIEF DESCRIPTION OF THE DRAWINGS

For a detailed description of various examples, reference will now be made to the accompanying drawings in which.

DETAILED DESCRIPTION

Figure 1:
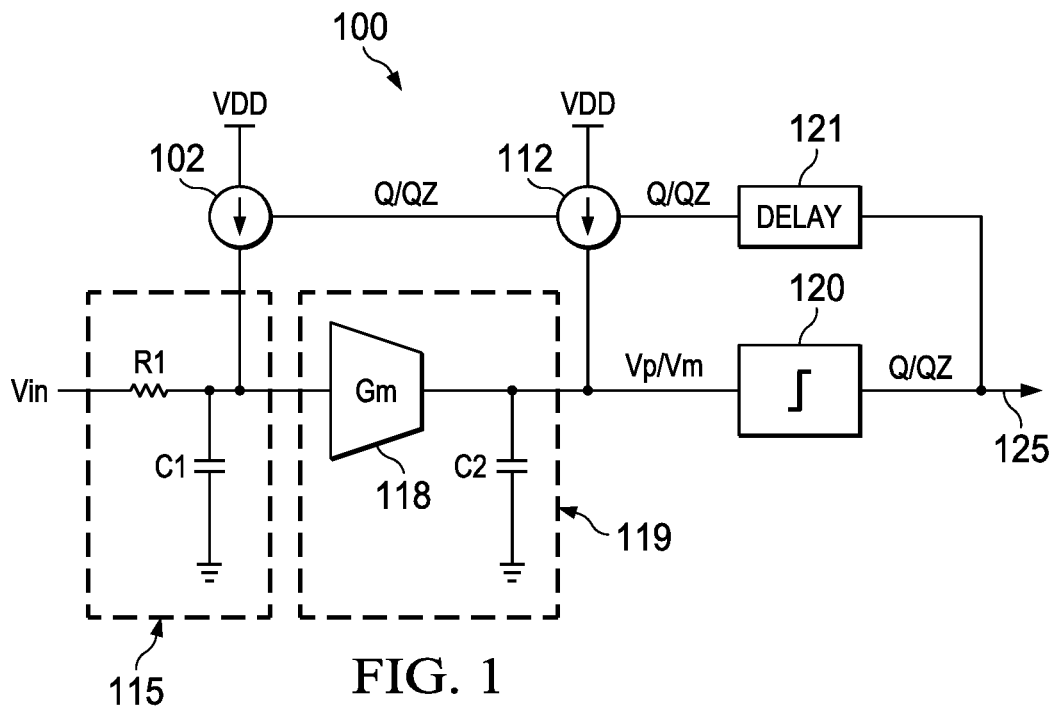
FIG. 1 is an example implementation of an ADC with a delta-sigma modulator.

FIG. 1 shows an example implementation of a second order delta-sigma modulator 100. In this example, the delta-sigma modulator 100 includes integrators 115 and 119, a comparator 120, and current digital-to-analog converters (DACs) 102 and 112. Delay 121 is also shown and delay 121 represents the propagation delay through the comparator 120. Integrator 115 includes resistor R1 and capacitor C1. Integrator 119 includes transconductance amplifier (Gm) 118 and capacitor C2. An input voltage, Vin, is provided to resistor R1 which generates the input current. For simplicity, Vin is shown in FIG. 1 as single-ended signal, but Vin may comprise a differential signal (Vinp and Vinm) and is illustrated as such in the example of FIG. 2. The other terminal of resistor R1 is connected to capacitor C1 (which, in turn, is connected to ground) and to an input of Gm 118. The output of Gm 118 is coupled to capacitor C2 and is used to form a differential signal comprising signals Vp and Vm, as is explained below. The output of GM 117 is coupled to the input of comparator 120.

The output of comparator 120 is shown as Q and QZ. Output QZ is the logical inverse of Q. Comparator 120 uses a clock signal (CLK) 121 to clock its decision onto its outputs Q and QZ. The decision is whether the input (VP-VM) is larger or smaller than a threshold. For example, Q is high and QZ is low responsive to VP-VM being larger than threshold, and low otherwise (VP-VM smaller than the threshold). The output of comparator 120 also is used to control the current DACs 112 and 102. In one example, responsive to Q being logic high, current from current DAC 112 is injected into the node between Gm 118 and comparator 120 comprising Vp. Responsive to Q being low (QZ being high), current from current DAC 112 is injected into the node comprising Vm. Current from current DAC 112 is injected into one, but not both, of the nodes comprising Vp or Vm depending on the state of the Q output of comparator 120. Similarly, current from current DAC 102 is injected into the positive signal node between the integrator 115 and the Gm 119 when Q is high, whereas current from the current DAC 102 is injected into the negative signal node between the integrator 115 and Gm 119 when Q is low.

As noted above, delay 121 represents the propagation delay through the comparator 120. FIG. 1 illustrates that the feedback loop comprising current DACs 102 and 112 uses the previous Q/QZ output from the comparator 120 while the comparator 120 is sampling new values of Vp and Vm. The delay introduced by comparator 120 can cause instability. One solution to the instability problem could be to add a pre-amplifier between integrator 119 and comparator 120, and a third current DAC to inject current into the node between the pre-amplifier and the comparator 120. Such a system would include three feedback loops, with the third feedback loop used to compensate the delay 121 caused by the comparator 120. This system would have three current DACs and a pre-amplifier resulting in a relatively complicated design. In accordance with the disclosed embodiments, the instability problem is addressed through the design of the comparator 120. Example comparator implementations are shown in FIGS. 3 and 5-8 and described below.

Figure 2:
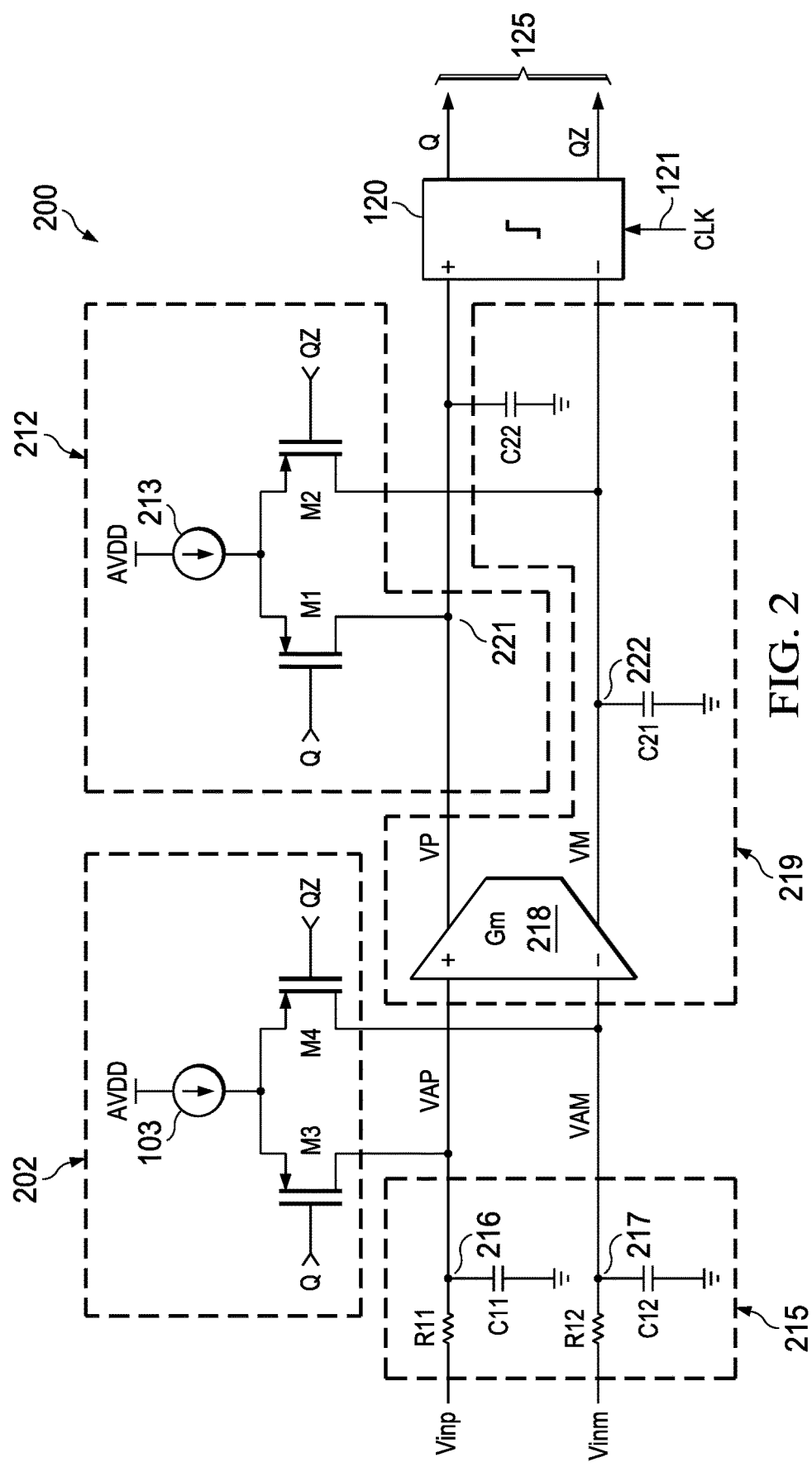
FIG. 2 is another example implementation of an ADC with a delta-sigma modulator and including compensation in the modulator's comparator for the delay introduced by the latch.

FIG. 2 shows another example implementation of a delta-sigma modulator 200. In the example of FIG. 2, the delta-sigma modulator 200 includes integrators 215 and 219, comparator 120, and current DACs 202 and 212. The input voltage comprises VINP and VINM. The integrator 215 includes two resistor-capacitor pairs R11/C11 and R12/C12. Each input voltage VINP/VINM is provided to its respective resistor R11/R12, and each resistor R11/R12 is connected to its respective capacitor C11/C12 at node 216/217 as shown. The voltage on node 216 is designated VAP and the voltage on node 217 is designated VAM. The positive input of GM 218 is coupled to resistor R11 and capacitor C11 at node 216. The negative input of GM 218 is coupled to resistor R12 and capacitor C12 at node 217. In this example, resistors R11 and R12 have the same resistance and capacitors C11 and C12 have the same capacitance. As such, voltage VAP is provided to the positive input of the GM 218, and voltage VAM is provided to the negative input of the GM 218. The positive output of the GM 218 is coupled to a positive input of comparator 120 at node 221, and the negative output of GM 218 is coupled to a negative input of comparator 120 at node 222. A capacitor C21 is coupled between node 222 and ground as shown. Similarly, a capacitor C22 is coupled between node 221 and ground. Capacitors C21 and C22 have the same capacitance in this example. Current from GM 218 as well as current from current DAC 202 charge capacitors C21 and C22 thereby forming a differential voltage comprising VP and VM. Comparator 120 includes a Q output and its logical inverse, QZ. A clock signal (CLK) is used to cause the comparator 120 to sample the input VP/VM.

Current DAC 202 comprises a current source device 103 and a pair of P-type metal oxide semiconductor field effect transistors (PMOS) M3 and M4. In other examples, transistors M3 and M4 can be implemented as different types of transistors. The sources of transistors M3 and M4 are connected to the current source device 103. The drain of transistor M3 is connected to node 216 (VAP), and the drain of transistor M4 is connected to node 217 (VAM). The gate of transistor M3 is coupled to the Q output of comparator 120, and the gate of transistor M4 is coupled to the QZ output of comparator 120. When Q is low and QZ is high, transistor M3 is on and transistor M4 is off, and current from current source device 103 flows through transistor M3 into node 216. Reciprocally, when Q is high and QZ is low, transistor M3 is off, transistor M4 is on, and current from current source device 103 flows through transistor M4 into node 217. As such, the current from current source device 103 flows either into node 216 or node 217 based on the logical state of the output of comparator 120.

Current DAC 212 includes a current source device 213, transistors M1 and M2. Transistors M1 and M2 comprise PMOS transistors in this example but can be implemented as other types of transistors in other examples. A transistor has a control input and a pair of current terminals For a MOS transistor, the control input is the gate and the current terminals comprise the source and drain. The sources of transistors M1 and M2 are connected to current source device 213. The drain of transistor M1 is connected to node 221 (VP), and the drain of transistor M2 is connected to node 222 (VM). The gate of transistor M1 is controlled by the Q output of comparator 120, and the gate of transistor M2 is controlled by the QZ output of comparator 120. When Q is low and QZ is high, transistor M1 is on and transistor M2 is off, and current from current source device 213 flows through transistor M1 into node 221. Reciprocally, when Q is high and QZ is low, transistor M1 is off, transistor M2 is on, and current from current source device 213 flows through transistor M2 into node 222. As such, the current from current source device 213 flows either into node 221 or node 222 based on the logical state of the output of comparator 120.

Figure 3:
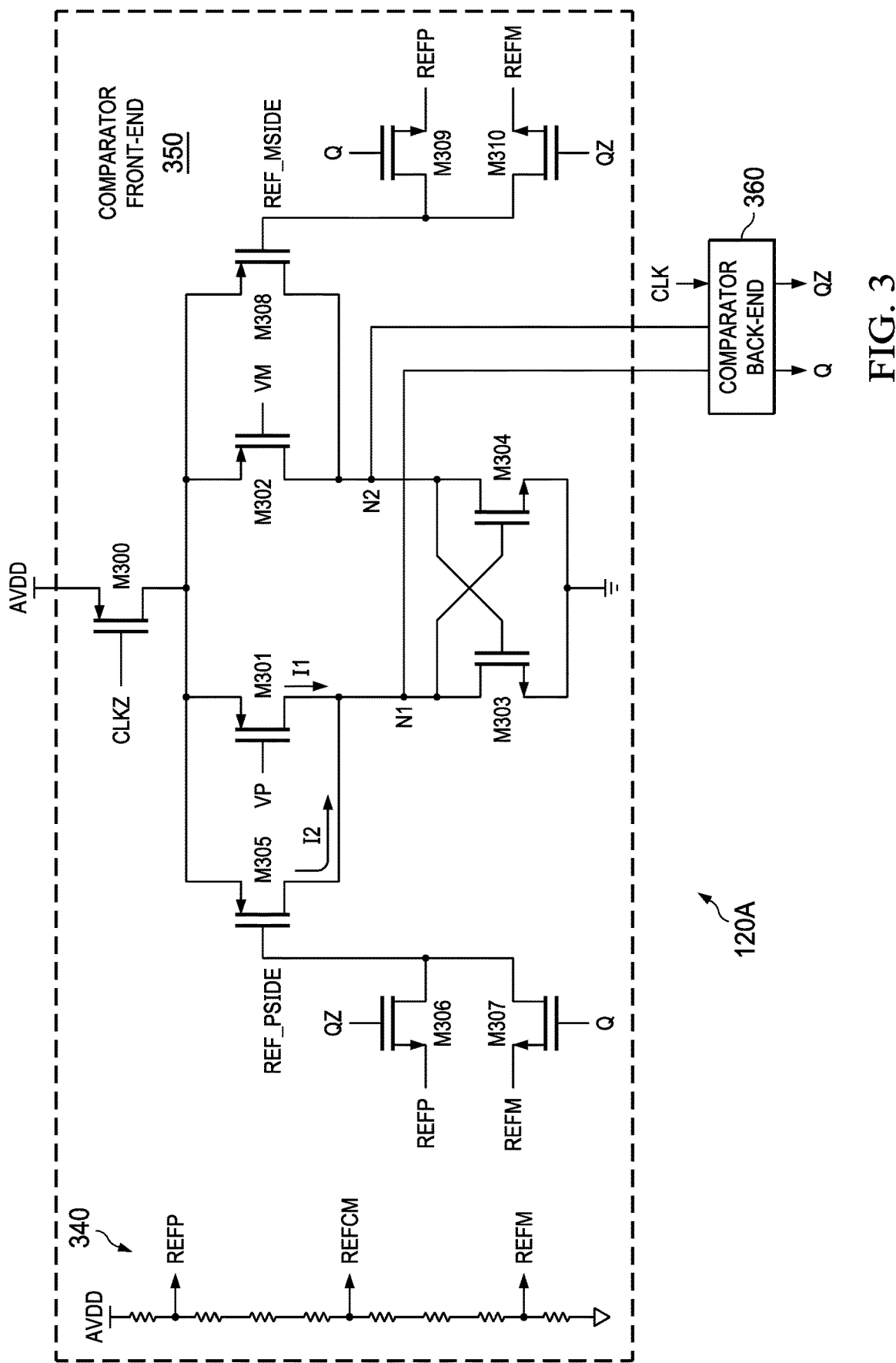
FIG. 3 is one example of the comparator.
Figure 5:
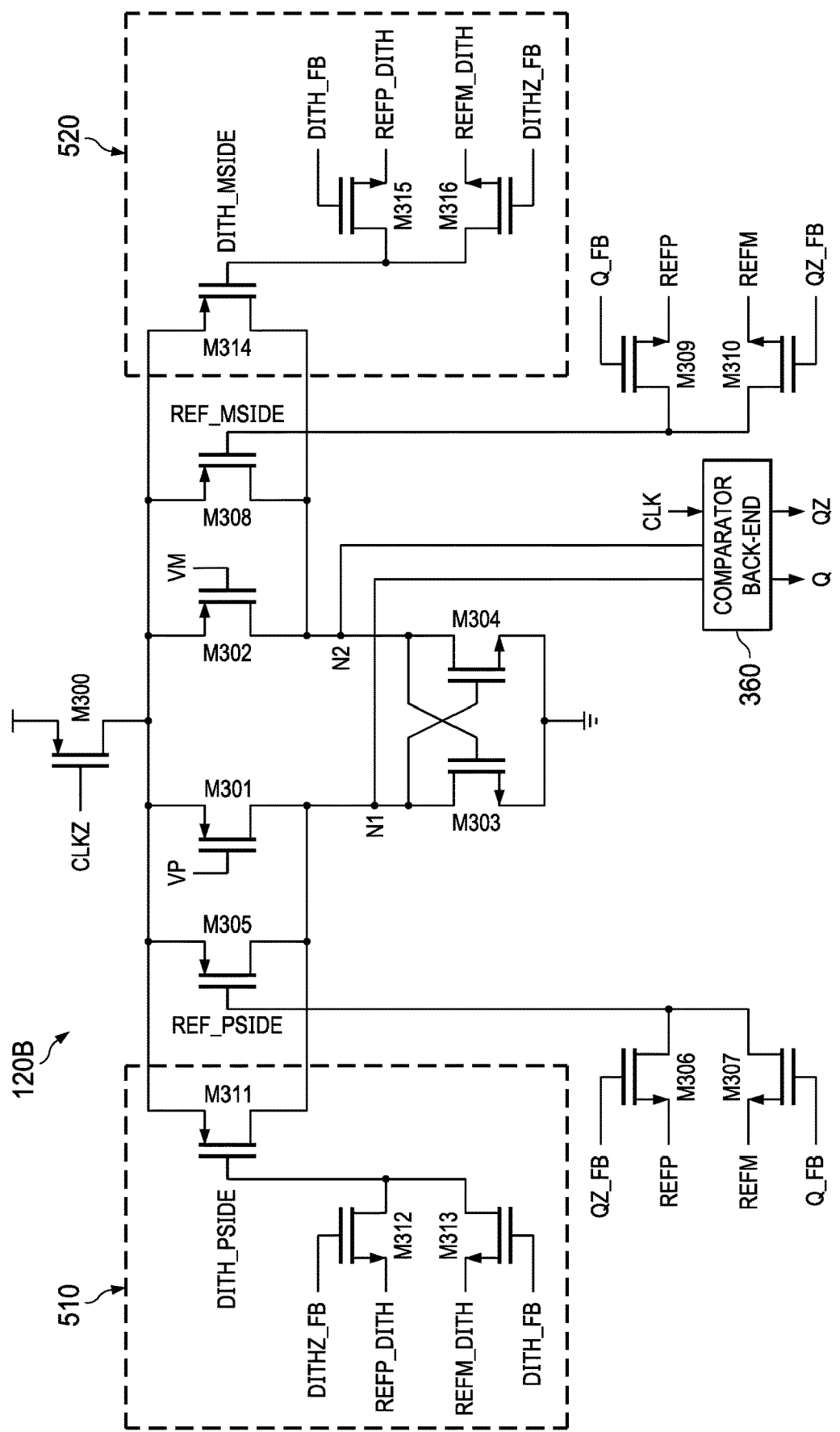
FIG. 5 is another example of a comparator for the modulator.
Figure 6:
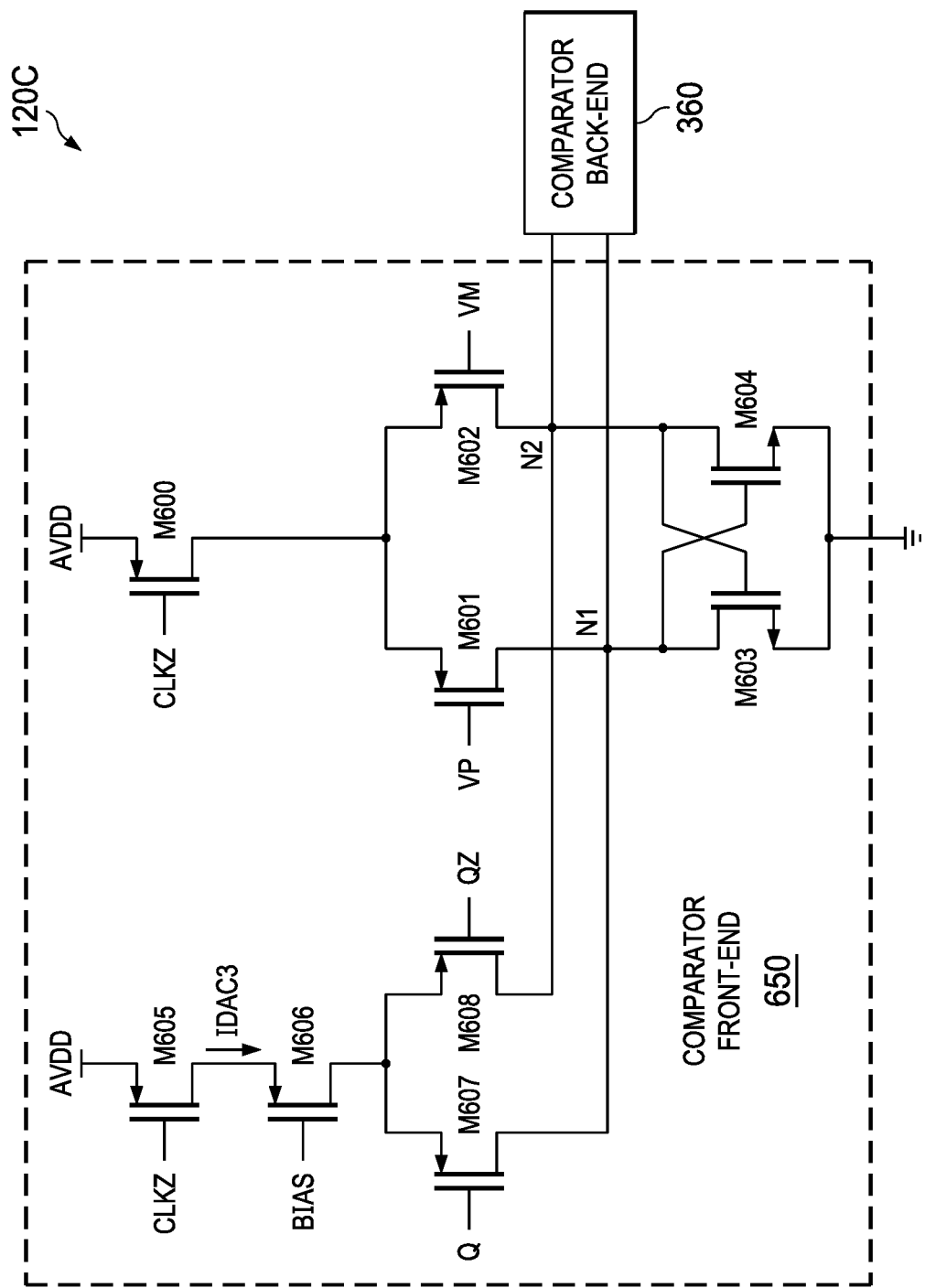
FIG. 6 is another example of a comparator for the modulator.
Figure 7:
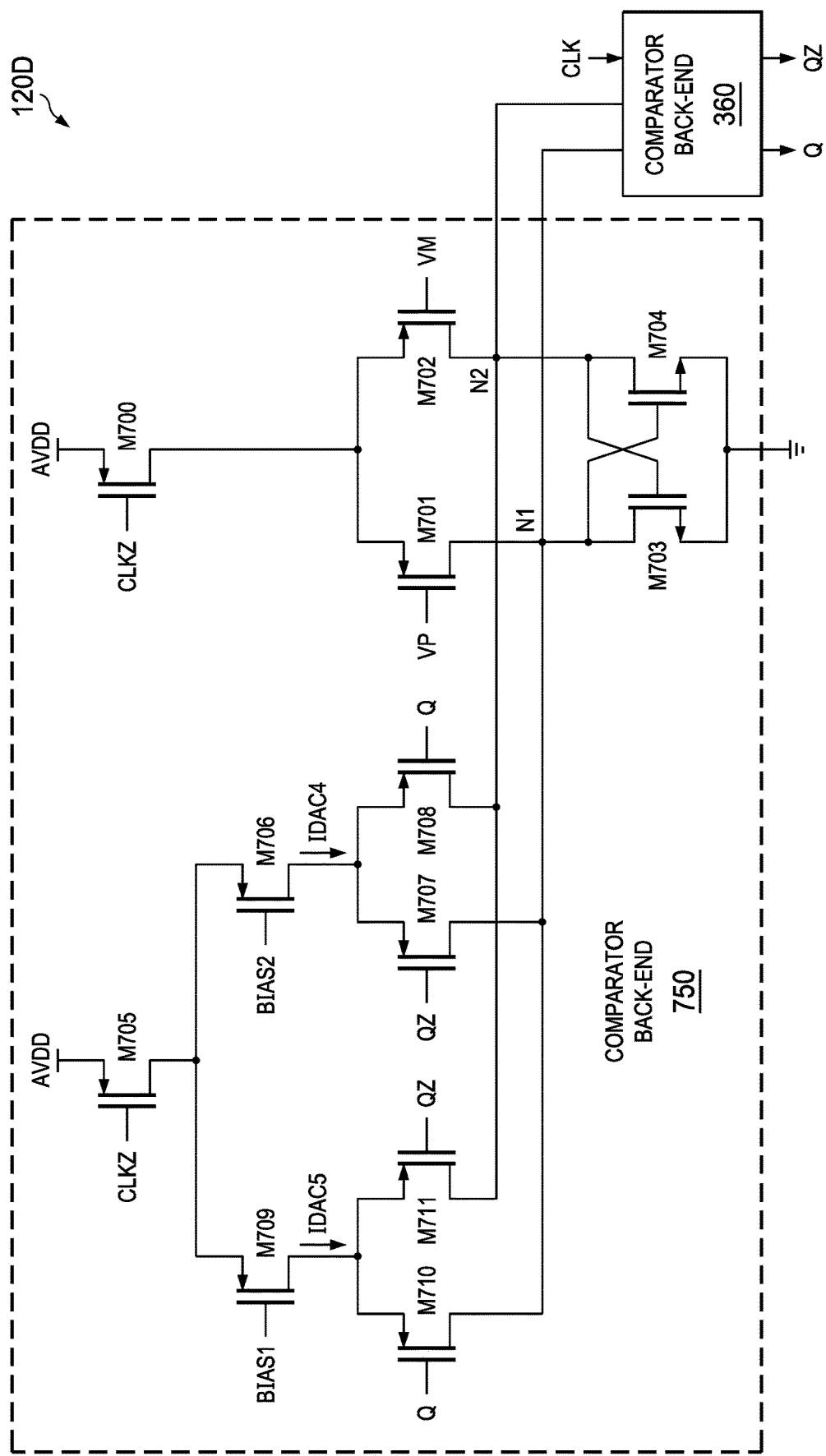
FIG. 7 is yet another example of a comparator for the modulator.
Figure 8:
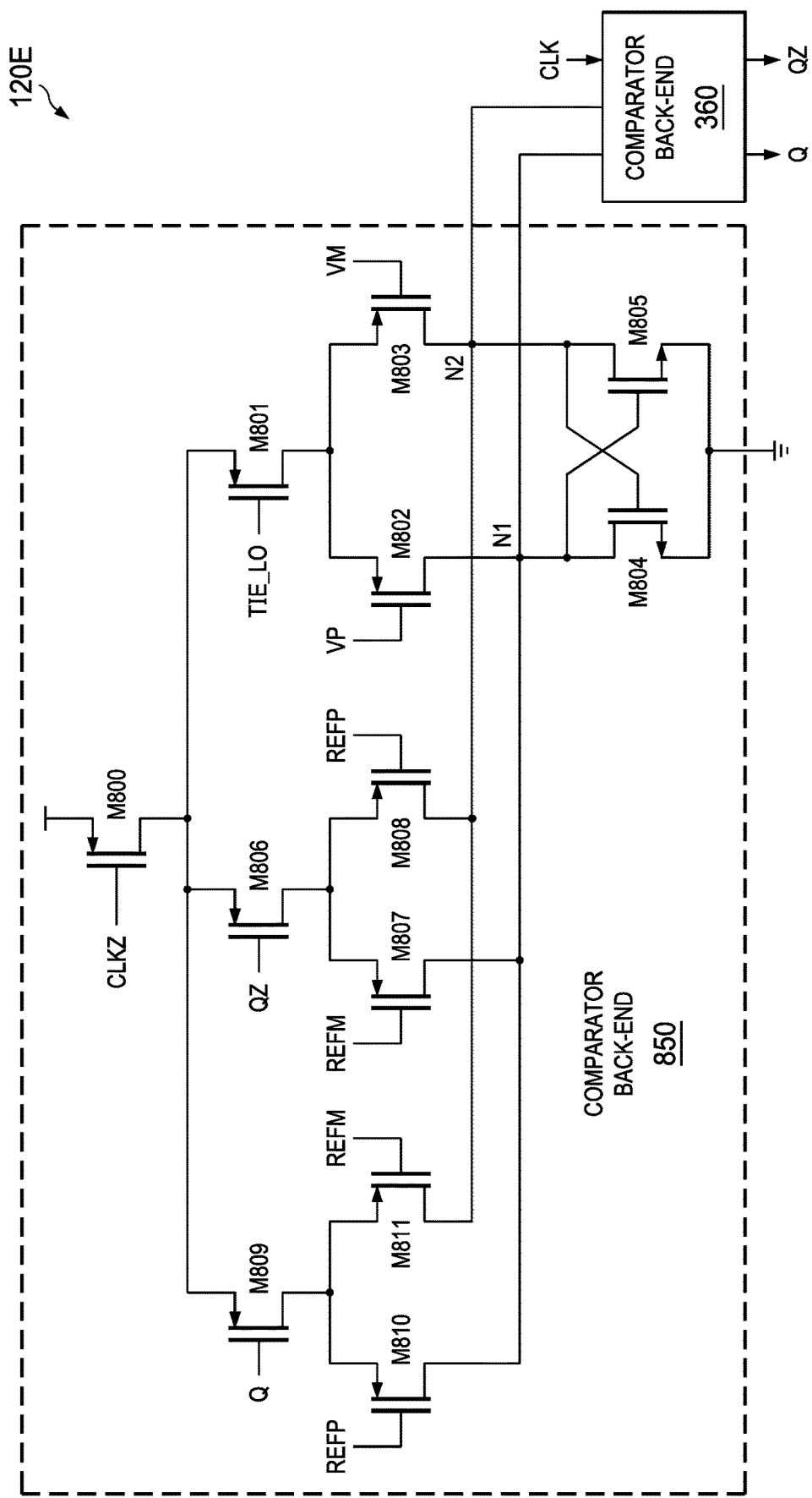
FIG. 8 is another example of a comparator for the modulator.

Example implementations of comparator 120 are shown in FIG. 3 (comparator 120A), FIG. 5 (comparator 120B), FIG. 6 (comparator 120C), FIG. 7 (comparator 120D), and FIG. 8 (comparator 120E). In the example of FIG. 3, comparator 120A has a comparator front-end 350 comprising transistors M300-M310 coupled to a comparator back-end 360. In this example, transistors M300-M302, M305, and M308 are PMOS transistors and transistors M303, M304, M306, M307, M309, and M310 are n-type metal oxide semiconductor field effect (NMOS) transistors. The source of M300 is coupled to the voltage supply node (AVDD), and the drain of M300 is coupled to the sources of M301, M302, M305, and M308. The drains of M301 and M305 are coupled together at node N1 and to the drain of M303 and gate of M304. Similarly, the drains of M302 and M308 are coupled together at node N2 and to the drain of M304 and gate of M303. The sources of M303 and M304 are coupled to the ground node. The gate of M301 receives VP from GM 218, and the gate of M302 receives VM. Nodes N1 and N2 comprise the output of the comparator front-end 350 and are coupled to inputs of the comparator back-end 360. The comparator's back-end 360 outputs Q as logic high (and QZ as logic low) if the difference between VP and VM is larger than the threshold of the comparator's back-end 360, and outputs Q as logic high (QZ low) if the difference is less than the threshold. The comparator back-end 360 may include hysteresis.

The gate of M305 is coupled to the drains of M306 and M307. The gate of M307 is driven by QZ, and the gate of M306 is driven by Q. As such, at any point in time only one of M306 or M307 is on. The source of M306 is coupled to a voltage source which provides a reference voltage REFP. The source of M307 is coupled to a voltage source which provides a reference voltage REFM. REFP is larger than REFM. In one example, REFP is 310 mV and REFM is 290 mV. In the example of FIG. 3, REFP and REFM are derived from a resistor ladder 340 as shown. The mid-point of the resistor ladder is labeled REFCM. REFCM is given as the reference voltage input to common mode feedback loop inside the GM 218 which ensures that GM output voltage common mode is equal to REFCM, which is the common mode voltage of comparator inputs VP and VM.

The voltage on the gate of M305 is a signal labeled REF_PSIDE. When QZ is high (and Q is low), M306 is on and REF_PSIDE is equal to REFP. When Q is high (and QZ is low), M307 is on and REF_PSIDE is equal to REFM.

The gate of M308 is coupled to the drains of M309 and M310. The gate of M309 is driven by Q, and the gate of M310 is driven by QZ. As such, at any point in time only one of M309 or M310 is on. The source of M309 is coupled to REFP, and the source of M310 is coupled to REFM. The voltage on the gate of M305 is a signal labeled REF_MSIDE. When Q is high (and QZ is low), M309 is on and REF_MSIDE is equal to REFP. When QZ is high (and Q is low), M310 is on and REF_MSIDE is equal to REFM. As such, when Q is high and QZ is low, REF_PSIDE is equal to REFM and REF_MSIDE is equal to REFP. Conversely, when Q is low and QZ is high, REF_PSIDE is equal to REFP and REF_MSIDE is equal to REFM.

The gate of M300 is driven by CLKZ (the logical inverse of CLK 121). When CLKZ is low, PMOS transistor M300 is on and the comparator 120 samples the input (the difference between VP and VM. When CLKZ is high, M300 is off and the comparator back-end 360 clocks the decision result (logical states of Q and QZ) as its output.

Figure 4:
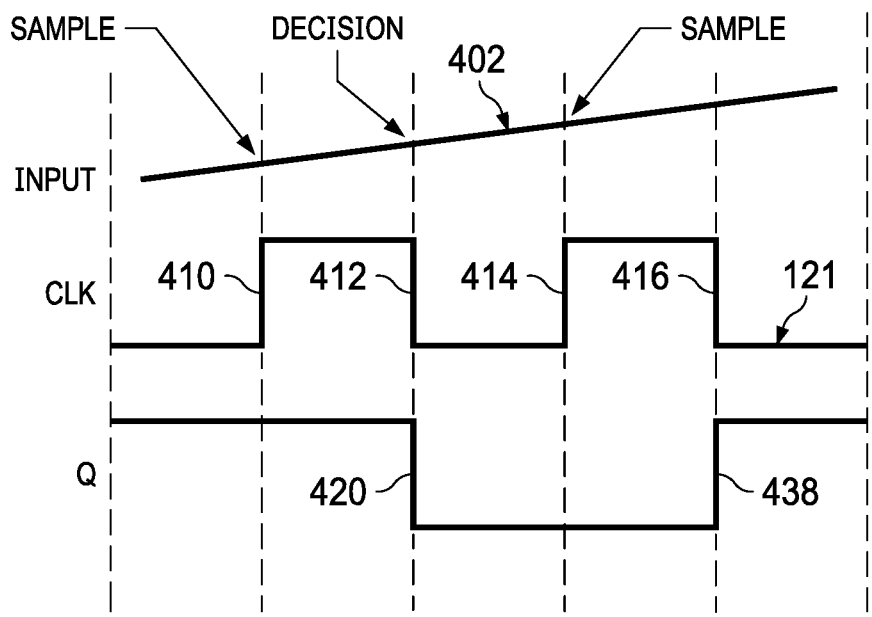
FIG. 4 is a timing diagram illustrating the operation of the comparator of FIG. 3.

FIG. 4 shows a timing diagram to illustrate the operation of comparator 120A. The timing diagram of FIG. 4 includes an input signal 402, the clock signal (CLK) 121, and the Q output of comparator 120. The input signal 402 represents the difference in voltage between VP and VM (output of Gm 218). In this example the input signal 402 is increasing as shown. The clock signal 121 is used to clock the comparator 120, and has rising edges 410 and 414, and falling edges 412 and 416 as shown. The comparator 120 samples the output signal from GM 218 (VP, VM) at rising edges 410 and 414 of the clock signal 121. The Q and QZ outputs from comparator 120 are available at falling edges 412 and 416.

When CLK is high, CLKZ is low and M300 is turned on to provide bias current to the comparator front-end. If VP is smaller than VM, M301 is turned on harder and thus more of the bias current flows through M301 than through M302.

M301 starts its operation in saturation and thus provides a drain current (I1, FIG. 3) into node N1 that is proportional to the voltage on its gate (drain current=gm_301*VP, where gm_301 is the transconductance of M301). The output impedance seen at node N1 is designated rout. Current I1 multiplied by rout is the output voltage on node N1 (V_N1). Thus, due to just the current I1 from M301, V_N1 equals Vp*gm_301*rout.

The current through M305 is shown as I2 in FIG. 3. The voltage on node N1 due to the current I2 from M305 is similarly calculated. With M305 also starting operation in saturation (either due to its gate voltage being REFP or REFM based on the state of Q and QZ), I2 is gm_305*REF_PSIDE, where gm_305 is the transconductance of M305. Thus, due to just the current I2 from M305, V_N1 equals REF_PSIDE*gm_305*rout.

In an example in which the channel width to length ratio (W/L) of M301 equals that of M305, gm_301 will equal gm_305. In that case, V_N1 will be equal to (VP+REF_PSIDE)*gm*rout, where gm is the transconductance of M301 and M305. Thus, the voltage on node N1, which is one of the inputs to the comparator back-end 360, is proportional to the sum of VP and REF_PSIDE.

M303 and M304 are cross-coupled as shown to reinforce the voltages on nodes N1 and N2. As the voltage on N1 rises due to M301 and M305 driven on harder than M302 and M308, M304 is turned on. With M304 being on, the voltage on node N2 is pulled low. Due to the cross-coupling configuration, the voltage at node N1 becomes logic high in this example. V_N1 and V_N2 are buffered and are fed to a flip-flop within the comparator back-end 360 whose outputs are Q and QZ.

In the absence of transistors M305-M320, the comparator's output is decided only by GM outputs VP/VM. VP/VM voltages linearly increase/decrease due to charging/discharging of the current into capacitors C21/C22. Transistors M305-M310 are provided so that comparator output also depends upon the previous decision Q/QZ This voltage addition/subtraction serves as the compensation for the delay of comparator 120.

FIG. 5 illustrates an example comparator 120B. The structure of comparator 120B includes the structure of comparator 120A from FIG. 3 but includes additional components to provide dithering. Dither is an intentionally applied form of noise used to randomize quantization error, preventing idle tones within the signal input to the comparator. In addition to the components of the comparator 120A of FIG. 3, the comparator 120B of FIG. 5 includes dither circuits 510 and 520. Dither circuit 510 includes transistors M311-M313 and dither circuit 520 includes transistors M314-M316. Transistors M311-M316. M311 and M314 comprise PMOS transistors and M312, M313, and M315, and M316 comprise NMOS transistors. Transistors M311-M313 are coupled together similar to M305-M307. The source of M311 is coupled to the drain of M300. The drain of M311 is coupled to the drains of M305 and M301 at node N1. The drains of M312 and M313 are coupled together and to the gate of M311. The signal on the gate of M311 is labeled DITH_PSIDE. The source of M312 receives a reference voltage labeled REFP_DITH and the source of M313 receives a reference voltage labeled REFM_DITH. REFP_DITH and REFM_DITH may be generated from the same resistor ladder 340 (FIG. 3) that generated REFP and REFM. REFP_DITH–REFM_DITH is smaller than REFP–REFM because the amount of noise current needed to add the dither signal is smaller than the amount of current needed for delay compensation.

The gate of M313 receives the control signal Q_FB and the gate of M312 receives the control signal QZ_FB which is the logical inverse of Q_FB. Q_FB and QZ_FB may be the same signals denoted in FIG. 3 as Q and QZ. These signals are generated after adding a flip-flop at the output of comparator. As such, DITH_PSIDE is equal to REFP_DITH when QZ_FB is high (and Q_FB is low) and DITH_PSIDSE is equal to REFM_DITH otherwise (Q_FB is high and QZ_FB is low).

Transistors M314-M316 are coupled together similar to M308-M310. The source of M314 is coupled to the drain of M300. The drain of M314 is coupled to the drains of M302 and M308 at node N2. The drains of M315 and M316 are coupled together and to the gate of M314. The signal on the gate of M314 is labeled DITH_MSIDE. The source of M315 receives REFP_DITH and the source of M316 receives REFM_DITH. The gate of M316 the control signal QZ_FB and the gate of M315 receives the control signal Q_FB. As such, DITH_MSIDE is equal to REFP_DITH when Q_FB is high (and QZ_FB is low) and DITH_MSIDSE is equal to REFM_DITH otherwise (QZ_FB is high and Q_FB is low). Further, when DITH_PSIDE is equal to REFP_DITH, DITH_MSIDE is equal to REFM_DITH, and vice versa.

Dither circuit 510 operates similar to the circuit comprising transistors M305-M307 but with different reference voltages and different control signals. The gate voltages for M313 and M312 are DITH_FB and DITHZ_FB, respectively, which are randomly generated digital signals by, for example, a digital circuit (not shown). Dither circuit 510 generates a random current which is added to total current at node N1. Dither circuit 520 functions similar to dither circuit 520 but increases the voltage node N2 when dither circuit 510 decreases the voltage on node N1, and vice versa.

FIG. 6 shows another example of a comparator 120C which includes a comparator front-end 650 coupled to the comparator back-end 360. In this example, the comparator front-end 650 includes transistors M600-M608. Transistors M601, M602 and M605-M608 are PMOS transistors and transistors M603 and M604 are NMOS transistors. The source of M600 is coupled to AVDD, and the drain of M600 is coupled to the sources of M601 and M602. The drains of M601 and M607 are coupled together at node N1 and to the drain of M603 and gate of M604. Similarly, the drains of M602 and M608 are coupled together at node N2 and to the drain of M604 and gate of M603. The sources of M603 and M604 are coupled to the ground node. The gate of M601 receives VP from GM 218, and the gate of M602 receives VM. Nodes N1 and N2 comprise the output of the comparator front-end 650 and are coupled to the inputs of the comparator back-end 360.

The gate of M607 is driven by Q and the gate of M608 is driven by QZ. The sources of M607 and M608 are coupled together and to the drain of M606. The source of M606 is coupled to the drain of M605, and the source of M605 is coupled to AVDD. The gate voltage of M606 receives a constant bias voltage and M606 operates in saturation region. The constant bias at the gate of M606 ensures a fixed current flowing through M606. IDAC3 flows through M607 or M608. The gates of M600 and M605 are driven by CLKZ.

When CLKZ is low, M605 turns on and current IDAC3 flows through M605 and M606 to either M607 or M608, depending on which of M607 and M608 are on. M607 is on when Q is low and M608 is on when QZ is low. When CLKZ becomes low, current IDAC3 is injected into either node N1 or node N2 depending on whether Q is high or low. M603 and M604 are cross-coupled transistors, which help in pulling nodes N1 and N2 to logic low/high based on whether Q or QZ is high/low.

FIG. 7 illustrates another example of a comparator 120D having a comparator front-end 760 coupled to comparator back-end 360. In this example, the comparator front-end 750 includes transistors M700-M711. Transistors M700-M702 and M705-M711 are PMOS transistors and transistors M703 and M704 are NMOS transistors. The source of M700 is coupled to AVDD, and the drain of M700 is coupled to the sources of M701 and M702. The drains of M701, M707, and M710 are coupled together at node N1 and to the drain of M703 and gate of M704. Similarly, the drains of M702, M708, and M711 are coupled together at node N2 and to the drain of M704 and gate of M703. The sources of M703 and M704 are coupled to the ground node. The gate of M701 receives VP from GM 218, and the gate of M702 receives VM. Nodes N1 and N2 comprise the output of the comparator front-end 750 and are coupled to the inputs of the comparator back-end 360.

The source of M705 is coupled to AVDD. The source of M705 is coupled to the sources of M706 and M709. The drain of M706 is coupled to the sources of M707 and M708. The drain of M709 is coupled to the sources of M710 and M711. The gate of M706 receives a bias voltage (BIAS2), and the gate of M709 receives a bias voltage (BIAS1). In one example, BIAS1 has a different voltage level than BIAS2. As such, the current through M706 (IDAC4) is different than the current through M709 (IDAC5). For examples, BIAS2 is smaller than BIAS1 and thus IDAC4 is larger than IDAC5.

When CLKZ is low, M705 turns on. Current IDAC4 flows through either M707 or M708 into the respective nodes N1 or N2 based on the state of Q/QZ. When QZ is low (Q is high), IDAC4 flows through M707 into node N1, and when Q is low (QZ is high), IDAC4 flows through M708 into node N2. At the same time and similarly, current IDAC5 flows through either M710 or M711 into the respective nodes N1 or N2 based on the state of Q/QZ. When Q is low (QZ is high) IDAC5 flows through M710 into node N1, and when QZ is low (Q is high), IDAC5 flows through M711 into node N2. BIAS1 and BIAS2 comprise two reference voltages whose difference is being compared with VP-VM.

FIG. 8 illustrates another example of a comparator 120E having a comparator front-end 860 coupled to comparator back-end 360. In this example, the comparator front-end 850 includes transistors M800-M811. Transistors M800-M802 and M805-M811 are PMOS transistors and transistors M803 and M804 are NMOS transistors. The source of M800 is coupled to AVDD, and the drain of M800 is coupled to the sources of M801, M806, and M809. The drains of M702, M807, and M810 are coupled together at node N1 and to the drain of M804 and gate of M805. Similarly, the drains of M803, M808, and M811 are coupled together at node N2 and to the drain of M805 and gate of M804. The sources of M804 and M805 are coupled to the ground node. The gate of M802 receives VP from GM 218, and the gate of M803 receives VM. Nodes N1 and N2 comprise the output of the comparator front-end 850 and are coupled to the inputs of the comparator back-end 360.

The drain of M806 is coupled to the sources of M807 and M808. The drain of M809 is coupled to the sources of M810 and M811. The gate of M809 receives signal Q from the comparator back-end 360, and the gate of M809 receives the complementary signal QZ. As such, only one of M806 or M809 is on concurrently depending on the logic state of Q/QZ. M809 is on when Q is low and M806 is on when QZ is low. The gates of M808 and M810 receive reference voltage REFP, and the gates of M807 and M811 receive reference voltage REFM.

When CLKZ is low, M800 turns on. Current IDAC4 flows through either M707 or M708 into the respective nodes N1 or N2 based on the state of Q/QZ. When QZ is low (Q is high), IDAC4 flows through M707 into node N1, and when Q is low (QZ is high), IDAC4 flows through M708 into node N2. At the same time and similarly, current IDAC5 flows through either M710 or M711 into the respective nodes N1 or N2 based on the state of Q/QZ. When Q is low (QZ is high) IDAC5 flows through M710 into node N1, and when QZ is low (Q is high), IDAC5 flows through M711 into node N2.

A current proportional to REFP-REFM flows into node N1 when Q is logic zero and M809 is turned on. A current proportional to REFM-REFP flows into node N1 when QZ is logic zero and M806 is turned on. Another current, which is proportional to VP-VM flows through node N1.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
   a transconductance stage having first and second outputs;
   a comparator having first and second inputs, the first input coupled to the first output, and the second input coupled to the second output, the comparator including:
   a first transistor having a control input and first and second current terminals;
   a second transistor having a control input and first and second current terminals;
   a pair of cross-coupled transistors coupled to the second current terminals of the first and second transistors;
   a third transistor having a control input and first and second current terminals, the second current terminal of the third transistor is coupled to the second current terminal of the first transistor, and the first current terminals of the first, second, and third transistors are coupled together;
   a fourth transistor having a control input and first and second current terminals; and
   a fifth transistor having a control input and first and second current terminals, the second current terminals of the fourth and fifth transistors are coupled together and to the control input of the third transistor.

2. The circuit of claim 1, wherein the control of the first transistor comprises the first input of the comparator, and the control input of the second transistor comprises the second input of the comparator.

3. The circuit of claim 1, wherein:
the comparator has first and second comparator outputs;
the control input of the fifth transistor is coupled to the first comparator output; and
the control input of the fourth transistor is coupled to the second comparator output.

4. The circuit of claim 3, wherein:
the first current terminal of the fourth transistor is coupled to a first reference voltage node; and
the first current terminal of the fifth transistor is coupled to a second reference voltage node.

5. The circuit of claim 4, wherein the first reference voltage node is configured to have a larger voltage than a voltage on the second reference voltage node.

6. The circuit of claim 1, wherein:
the first current terminal of the fourth transistor is coupled to a first reference voltage node; and
the first current terminal of the fifth transistor is coupled to a second reference voltage node.

7. The circuit of claim 1, wherein:
a sixth transistor having a control input and first and second current terminals, the second current terminal of the sixth transistor is coupled to the second current terminal of the second transistor;
a seventh transistor having a control input and first and second current terminals; and
an eighth transistor having a control input and first and second current terminals, the second current terminals of the seventh and eighth transistors are coupled together and to the control input of the sixth transistor.

8. The circuit of claim 7, wherein:
the comparator has first and second comparator outputs;
the control inputs of the fifth and seventh transistors are coupled to the first comparator output; and
the control inputs of the fourth and eighth transistors are coupled to the second comparator output.

9. The circuit of claim 8, wherein:
the first current terminals of the fourth and seventh transistors are coupled to a first reference voltage node; and
the first current terminals of the fifth and eighth transistor are coupled to a second reference voltage.

10. The circuit of claim 1, further comprising:
a first dither circuit coupled to the first transistor; and
a second dither circuit coupled to the second transistor.

11. A circuit, comprising:
a first transistor having a control input and first and second current terminals;
a second transistor having a control input and first and second current terminals;
a third transistor having a control input and first and second current terminals, the second current terminal of the third transistor is coupled to the second current terminal of the first transistor;
a fourth transistor having a control input and first and second current terminals, the second current terminal of the fourth transistor is coupled to the second current terminal of the second transistor, and the first current terminals of the first, second, third, and fourth transistors are coupled together;
a second pair of transistors coupled to the control input of the third transistor, the second pair of transistors configured to alternate between application of a first reference voltage and a second reference voltage to the control input of the third transistor;
a third pair of transistors coupled to the control input of the fourth transistor, the third pair of transistors configured to alternate between application of the second reference voltage and the first reference voltage to the control input of the fourth transistor, with the second reference voltage applied to the control input of the fourth transistor when the first reference voltage is applied to the control input of the third transistor, and with the first reference voltage applied to the control input of the fourth transistor when the second reference voltage is applied to the control input of the third transistor.

12. The circuit of claim 11, wherein:
the first pair of transistors includes a fifth transistor having a control input and first and second current terminals and a sixth transistor having a control input and first and second current terminals, the second current terminals of the fifth and sixth transistors are coupled together and to the control input of the third transistor, the first current input of the fifth transistor is configured to receive the first reference voltage, and the first current input of the sixth transistor is configured to receive the second reference voltage.

13. The circuit of claim 12, wherein:
the second pair of transistors includes a seventh transistor having a control input and first and second current terminals and an eighth transistor having a control input and first and second current terminals, the second current terminals of the seventh and eighth transistors are coupled together and to the control input of the fourth transistor, the first current input of the seventh transistor is configured to receive the first reference voltage, and the first current input of the eighth transistor is configured to receive the second reference voltage.

14. The circuit of claim 11, further comprising:
a first dither circuit coupled to the first transistor; and
a second dither circuit coupled to the second transistor.

15. The circuit of claim 14, wherein:
the first dither circuit includes a fifth transistor and a fourth pair of transistors, the fifth transistor including a control input and first and second current terminals, the first and second current terminals of the fifth transistor is coupled to the first and second current terminals, respectively, of the first transistor, and the fourth pair of transistors is coupled to the control input of the fifth transistor; and
the second dither circuit includes a sixth transistor and a fifth pair of transistors, the sixth transistor including a control input and first and second current terminals, the first and second current terminals of the fifth transistor is coupled to the first and second current terminals, respectively, of the second transistor, and the fifth pair of transistors is coupled to the control input of the sixth transistor.

16. The circuit of claim 11, further including a transconductance stage having first and second outputs, the first output is coupled to the control input of the first transistor, and the second output is coupled to the control input of the second transistor.

17. A circuit, comprising:
a comparator having a front-end and a back-end, the comparator's back-end having a first comparator output and a second comparator output, comparator's front-end including:

a first transistor having a control input and first and second current terminals, the control input of the first transistor is coupled to the first comparator output;

a second transistor having a control input and first and second current terminals, the control input of the second transistor is coupled to the second comparator output;

a pair of cross-coupled transistors coupled to the second current terminals of the first and second transistors and to the back-end;

a third transistor having a control input and first and second current terminals, the second current terminal of the third transistor is coupled to the second current terminal of the first transistor, and the first current terminals of the first, second, and third transistors are coupled together;

a fourth transistor having a control input and first and second current terminals; and a fifth transistor having a control input and first and second current terminals, the second current terminals of the fourth and fifth transistors are coupled together and to the control input of the third transistor.

18. The circuit of claim 17, wherein:

the control input of the fifth transistor is coupled to the first comparator output; and the control input of the fourth transistor is coupled to the second comparator output.

19. The circuit of claim 17, wherein:

the first current terminal of the fourth transistor is coupled to a first reference voltage node; and the first current terminal of the fifth transistor is coupled to a second reference voltage node.

20. The circuit of claim 17, further comprising:

a sixth transistor having a control input and first and second current terminals, the second current terminal of the sixth transistor is coupled to the second current terminal of the second transistor;

a seventh transistor having a control input and first and second current terminals; and an eighth transistor having a control input and first and second current terminals, the second current terminals of the seventh and eighth transistors are coupled together and to the control input of the sixth transistor.

* * * * *